(12) United States Patent
Ji et al.

(10) Patent No.: US 12,150,278 B2
(45) Date of Patent: Nov. 19, 2024

(54) HEAT DISSIPATING APPARATUS FOR ELECTRONIC ELEMENTS

(71) Applicant: KMW INC., Hwaseong-si (KR)

(72) Inventors: Kyo Sung Ji, Hwaseong-si (KR); Bae Mook Jeong, Suwon-si (KR); In Hwa Choi, Yongin-si (KR)

(73) Assignee: KMW INC., Hwaseong-si (KR)

( * ) Notice: Subject to any disclaimer, the term of this patent is extended or adjusted under 35 U.S.C. 154(b) by 196 days.

(21) Appl. No.: 17/881,653

(22) Filed: Aug. 5, 2022

(65) Prior Publication Data

US 2022/0377941 A1 Nov. 24, 2022

Related U.S. Application Data

(63) Continuation of application No. PCT/KR2021/001451, filed on Feb. 4, 2021.

(30) Foreign Application Priority Data

Feb. 7, 2020 (KR) .................. 10-2020-0015080
Feb. 4, 2021 (KR) .................. 10-2021-0015840

(51) Int. Cl.
*H05K 7/20* (2006.01)
*H01Q 1/02* (2006.01)
*H05K 7/14* (2006.01)

(52) U.S. Cl.
CPC .......... *H05K 7/20327* (2013.01); *H01Q 1/02* (2013.01); *H05K 7/1427* (2013.01); *H05K 7/2039* (2013.01)

(58) Field of Classification Search
CPC . H05K 7/20327; H05K 7/2039; H05K 7/1427
See application file for complete search history.

(56) References Cited

U.S. PATENT DOCUMENTS 8,780,556 B1 * 7/2014 Ditri .................. H05K 7/1404
174/15.1
2004/0075986 A1 4/2004 Schwarz
(Continued)

FOREIGN PATENT DOCUMENTS

EP 3570299 A1 11/2019
KR 20-0263467 Y1 2/2002
KR 20-2018-0001423 U 5/2018

OTHER PUBLICATIONS

International Search Report mailed May 20, 2021 for International Application No. PCT/KR2021/001451 and its English translation.
(Continued)

*Primary Examiner* — Adrian S Wilson
(74) *Attorney, Agent, or Firm* — Insight Law Group, PLLC; Seung Lee

(57) ABSTRACT

Provided is a heat dissipating apparatus for electronic elements which has the minimum size but has improved heat dissipating performance. To this end, the heat dissipating apparatus for electronic elements, according to the present invention, comprises: a heat dissipating housing having an internal space; a shield case formed of a thermally conductive material, wherein the shield case is disposed in the heat dissipating housing and partitions the internal space into a first chamber which is a vacuum space to be filled with a refrigerant and a second chamber which is a non-vacuum space; and a printed circuit board which is disposed in the shield case and has a heat dissipating element. The shield case evaporates the refrigerant by using sensible heat transferred from the heat dissipating element to the shield case and latent heat transferred from the shield case to the first chamber.

20 Claims, 11 Drawing Sheets

(56) References Cited

U.S. PATENT DOCUMENTS

| | | | |
|---|---|---|---|
| 2014/0216711 A1* | 8/2014 | Shelnutt | F28D 15/0266 |
| | | | 165/104.19 |
| 2016/0073548 A1* | 3/2016 | Wei | H05K 7/203 |
| | | | 165/104.21 |
| 2017/0142820 A1* | 5/2017 | Christiansen | H05K 1/0204 |
| 2019/0320557 A1 | 10/2019 | Christlansen et al. | |

OTHER PUBLICATIONS

Non-final office action mailed Jun. 28, 2022 for Korean Application No. 10-2021-0015840.

\* cited by examiner

HEAT DISSIPATING APPARATUS FOR ELECTRONIC ELEMENTS

CROSS-REFERENCE TO RELATED APPLICATIONS

This application is a continuation application of International Application No. PCT/KR2021/001451, filed Feb. 4, 2021, which claims the benefit of Korean Patent Application Nos. 10-2020-0015080, filed Feb. 7, 2020; and 10-2021-0015840, filed Feb. 4, 2021, in the Korean Intellectual Property Office, the disclosures of which are incorporated herein in their entirety by reference.

TECHNICAL FIELD

The present disclosure relates to a cooling apparatus for electronic elements, and more particularly, to a cooling apparatus for electronic elements that dissipates heat generated from a heat source such as an antenna element mounted on a printed circuit board.

BACKGROUND ART

A wireless communication technology, for example, multiple input multiple output (MIMO) technology, is a technology that uses a plurality of antennas to dramatically increase a data transmission capacity and is a spatial multiplexing technique in which a transmitter transmits different data through each transmission antenna, and a receiver classifies pieces of transmitted data through appropriate signal processing.

Accordingly, as the numbers of transmission and reception antennas are simultaneously increased, a channel capacity is increased so that more data can be transmitted. For example, when the number of antennas is increased to ten, about ten times the channel capacity is secured using the same frequency band compared to a current single antenna system.

Up to eight antennas are used in fourth generation (4G) long term evolution-advanced (LTE-A), and currently, products equipped with 64 or 128 antennas are being developed in a pre-fifth generation (5G) stage, and in 5G, it is expected that a base station equipment with a much larger number of antennas will be used, and this is referred to as a massive MIMO technology. A current cell operation is dimension, whereas, when the massive MIMO technology is introduced, three-dimensional (3D)-beamforming becomes possible, so it is also referred to as an FD (full dimension)-MIMO technology.

In the massive MIMO technology, as the number of antennas increases, the number of transmitters and filters also increases accordingly. Nevertheless, due to a lease cost of the installation site or constrains of space, for coverage extension and high output power in the massive MIMO technology, it is required to miniaturize radio frequency elements (antenna/filter/power amplifier/transceiver, etc.) and reducing weights and costs thereof. Power consumption and a heating value due to such high output power act as negative factors in reducing weight and size thereof.

In particular, when a MIMO antenna in which RF elements and digital elements-implemented modules are coupled in a stacked structure is installed in a limited space, in order to maximize installation easiness or space utilization, there is an emerging need for compactness and a miniaturization design with respect to a plurality of layers constituting the MIMO antenna. In this case, there is a need for a design for a new heat dissipation structure for heat generated from communication elements mounted on the plurality of layers.

Korean Patent Laid-Open Application No. 10-2019-0118979 (publication date: Oct. 21, 2019) (hereinafter, referred to as the "related art") discloses a "Multi Input and Multi Output Antenna Apparatus" to which a heat dissipation structure for compactness and miniaturization design for a plurality of layers constituting a MIMO antenna is applied.

The related art includes a heat dissipation main body with a heat dissipation fin provided to protrude, and a plurality of unit heat dissipation bodies installed in the heat dissipation main body. Each of the plurality of unit heat dissipation bodies has one end provided to be in contact with a heating element of an antenna substrate, and the other end on which a plurality of sub heat dissipation fins for dissipating heat conducted from the heating element to the outside are provided.

However, in the related art, the structure for dissipating the heat of the heating element includes only a mechanical structure that is an air-cooled heat dissipation structure through heat exchange with external air.

Therefore, there is a problem in that it difficult to quickly dissipate heat and more mechanical heat dissipation structures are required for rapid heat dissipation so that a size of the structure is increased.

SUMMARY OF INVENTION

Technical Problem

An object of the present disclosure is to provide a cooling apparatus for electronic elements which has a minimized size and improved heat dissipation performance.

In addition, another object of the present disclosure is to provide a cooling apparatus for electronic elements, which is capable of rapidly dissipating heat generated from a heating element through a phase change of a refrigerant.

It should be noted that objects of the present disclosure are not limited to the above-described objects, and other objects of the present disclosure will be apparent to those skilled in the art from the following descriptions.

Solution to Problem

A cooling apparatus for electronic elements may include a heat dissipating housing, a shield case, and a printed circuit board. An internal space may be formed in the heat dissipating housing. The shield case may be formed of a thermally conductive material. The shield case may be disposed in the heat dissipating housing to partition the internal space into a first chamber and a second chamber. The first chamber may be a vacuum space filled with a refrigerant. The second chamber may be a non-vacuum space. The printed circuit board may be disposed in the shield case. A heating element may be provided on the printed circuit board. The shield case may evaporate the refrigerant using sensible heat transferred from the heating element to the shield case and latent heat transferred from the shield case to the first chamber.

The heat dissipating housing may be formed in the form of a bellows.

A heat dissipating fin may be formed to protrude from an outer surface of the heat dissipating housing.

A power supply unit may be disposed in the first chamber. The power supply unit may supply electric power to the printed circuit board.

A finger guard may surround an outer side of the heat dissipating housing. A plurality of holes may be formed in the finger guard.

The cooling apparatus for electronic elements may further include a spray nozzle and a refrigerant pump. The spray nozzle may spray the refrigerant into the first chamber. The refrigerant pump may supply the refrigerant to the spray nozzle.

The cooling apparatus for electronic elements may further include a pressure detection sensor and a controller. The pressure detection sensor may detect a pressure of the first chamber. The controller may operate the refrigerant pump when the pressure of the first chamber detected by the pressure detection sensor is less than or equal to a first set pressure, and the controller may stop the refrigerant pump when the pressure of the first chamber detected by the pressure detection sensor is greater than or equal to a second set pressure. Here, the second set pressure may be a pressure that is higher than the first set pressure.

The refrigerant pump may supply the refrigerant condensed in the first chamber to the spray nozzle.

The heat dissipating housing may include a housing body and a rear cover. The rear cover may cover an open rear surface of the housing body. A cylindrical-shaped insertion part may be formed to protrude forward from a front surface of the rear cover. The first chamber may correspond to an outer space of the insertion part of the internal space of the housing body. The second chamber may be an internal space of the insertion part.

A shield plate may be further disposed in the heat dissipating housing. In this case, the shield plate may cover an open front end of the insertion part inserted into the housing body, and the shield case may be spaced apart from the shield plate to be disposed in the first chamber.

A cooling apparatus for electronic elements may include a heat dissipating housing and a printed circuit board. An internal space may be formed in the heat dissipating housing. The printed circuit board may be disposed in the heat dissipating housing to partition the internal space into a first chamber and a second chamber. The first chamber may be a vacuum space filled with a refrigerant. The second chamber may be a non-vacuum space. A heating element may be provided on the printed circuit board. The printed circuit board may be coated so as to prevent the refrigerant from infiltrating. The refrigerant may be evaporated by heat generated from the heating element.

The heat dissipating housing may be formed in the form of a bellows.

A heat dissipating fin may be formed to protrude from an outer surface of the heat dissipating housing.

A power supply unit may be disposed in the first chamber. The power supply unit may supply electric power to the printed circuit board.

A finger guard may surround an outer side of the heat dissipating housing. A plurality of external air entrance holes may be formed in the finger guard.

The cooling apparatus for electronic elements may further include a spray nozzle and a refrigerant pump. The spray nozzle may spray the refrigerant into the first chamber. The refrigerant pump may supply the refrigerant to the spray nozzle.

The cooling apparatus for electronic elements may further include a pressure detection sensor and a controller. The pressure detection sensor may detect a pressure of the first chamber. The controller may operate the refrigerant pump when the pressure of the first chamber detected by the pressure detection sensor is less than or equal to a first set pressure, and the controller may stop the refrigerant pump when the pressure of the first chamber detected by the pressure detection sensor is greater than or equal to a second set pressure. Here, the second set pressure may be a pressure that is higher than the first set pressure.

The refrigerant pump may supply the refrigerant condensed in the first chamber to the spray nozzle.

The heat dissipating housing may include a housing body and a rear cover. The rear cover may cover an open rear surface of the housing body. A tubular-shaped insertion part may be formed to protrude forward from a front surface of the rear cover. At least one flat portion on which the printed circuit board is mounted may be formed on an outer surface of the insertion part. The first chamber may correspond to an outer space of the flat portion of the internal space of the housing body. The second chamber may be an internal space of the insertion part.

The details of other embodiments are included in the detailed description and the accompanying drawings.

Advantageous Effects of Invention

In accordance with a cooling apparatus for electronic elements according to the present disclosure, when a shield case is provided, a printed circuit board provided with a heating element is installed inside the shield case so that and heat generated from the heating element can be transferred to the shield case. The heat transferred to the shield case can be heat-exchanged with the refrigerant of the first chamber so that the refrigerant can be evaporated and the heat can be dissipated.

In addition, in accordance with the cooling apparatus for electronic elements according to the present disclosure, when the printed circuit board is coated to prevent the refrigerant from infiltrating into the printed circuit board without the shield case, the refrigerant of the first chamber can exchange heat generated from the heating element so that the refrigerant can be evaporated and the heat can be dissipated.

As described above, according to the cooling apparatus for electronic elements according to the present disclosure, there is an effect in that heat generated from the heating element can be rapidly dissipated through a phase change of the refrigerant, and there is no need to install lots of mechanical air cooling heat dissipation structures so that a size of the cooling apparatus can be reduced.

It should be noted that effects of the present disclosure are not limited to the above-described effects, and other effects of the present disclosure not mentioned will be apparent to those skilled in the art from the appended claims.

DESCRIPTION OF REFERENCE NUMERALS

Figure 1:
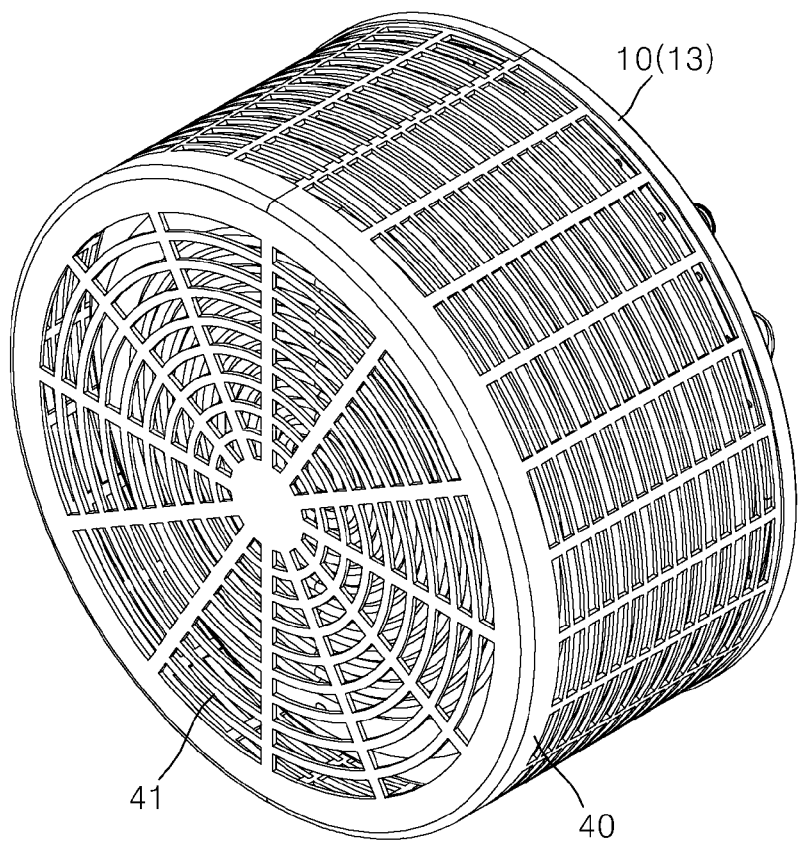
FIG. 1 is a perspective view illustrating a cooling apparatus for electronic elements according to a first embodiment of the present disclosure.

10: heat dissipating housing 11: housing body
11A: first pleated part 11B: heat dissipating fin
12: front cover 12A: second pleated part
13: rear cover 13A: insertion part
20: shield case 30: printed circuit board
40: finger guard 41: external air entrance hole
50: power supply unit 60: shield plate
C1: first chamber C2: second chamber

DESCRIPTION OF EMBODIMENTS

Hereinafter, a cooling apparatus for electronic elements according to embodiments of the present disclosure will be described with reference to the accompanying drawings.

Figure 2:
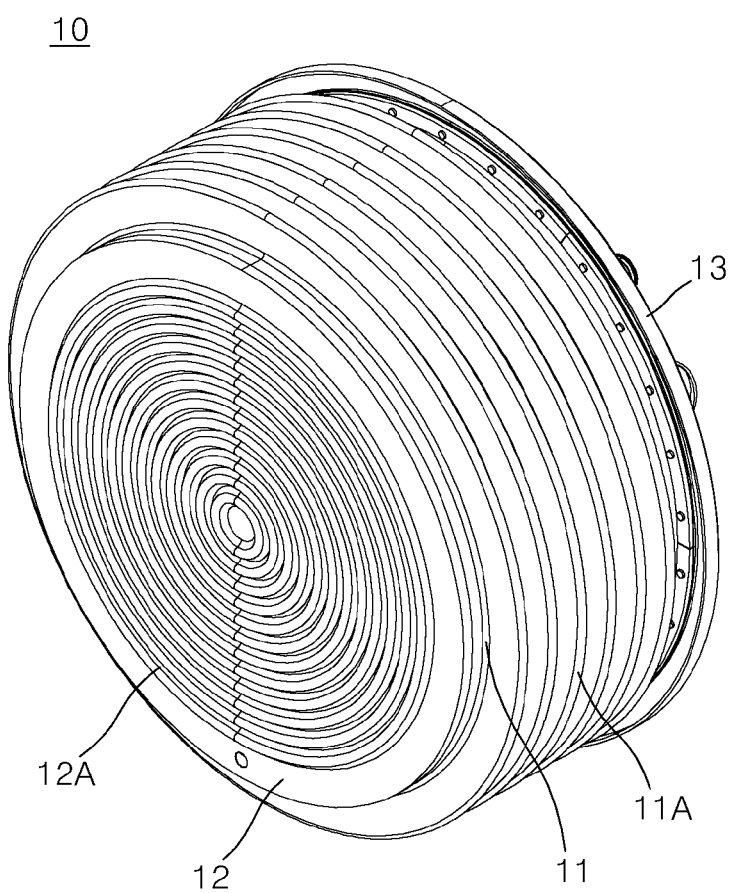
FIG. 2 is a perspective view illustrating a state in which a finger guard is removed from FIG. 1.
Figure 3:
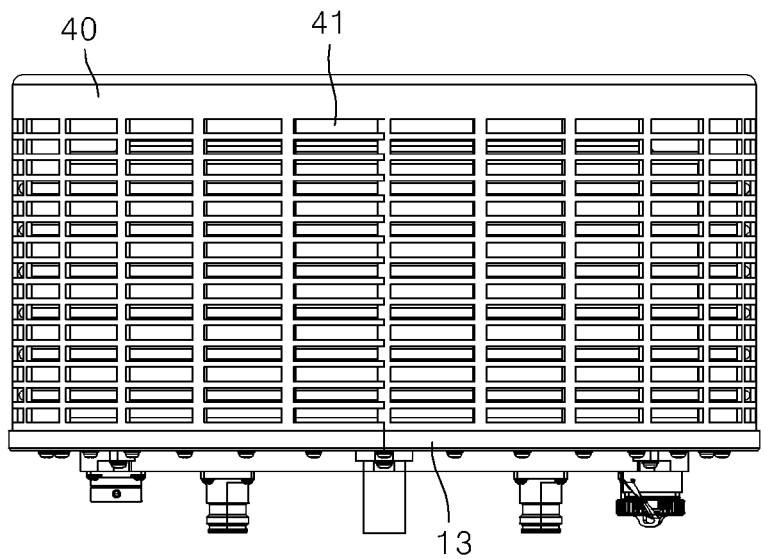
FIG. 3 is a plan view of FIG. 1.
Figure 4:
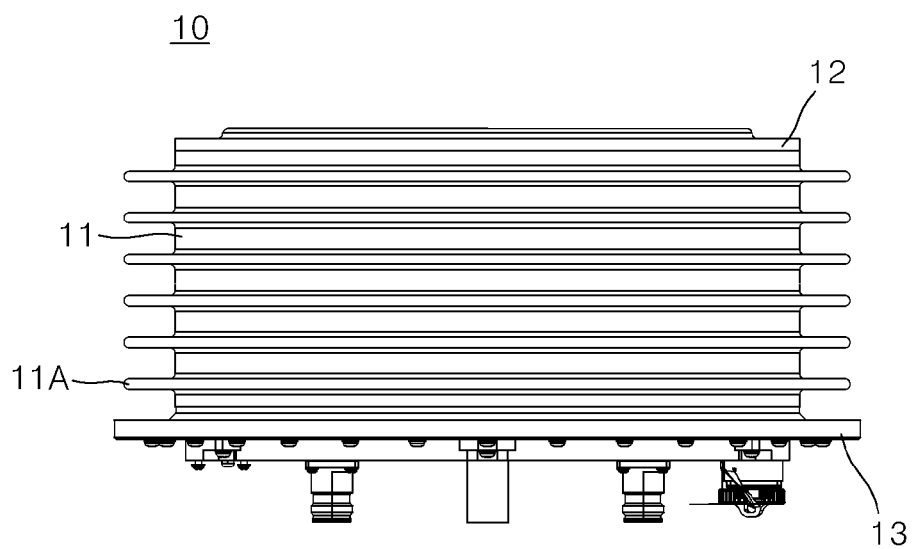
FIG. 4 is a plan view illustrating a state in which the finger guard is removed from FIG. 3.
Figure 5:
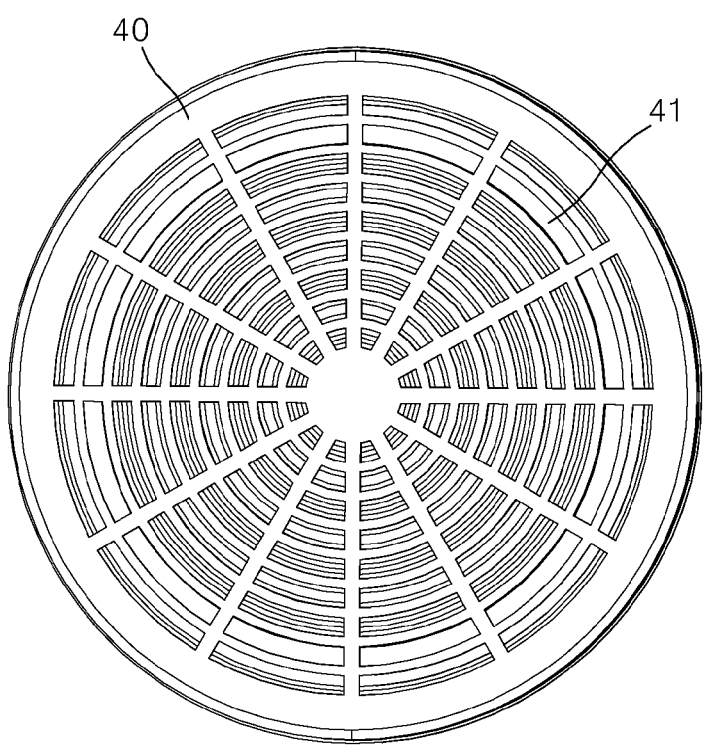
FIG. 5 is a front view of FIG. 1.
Figure 6:
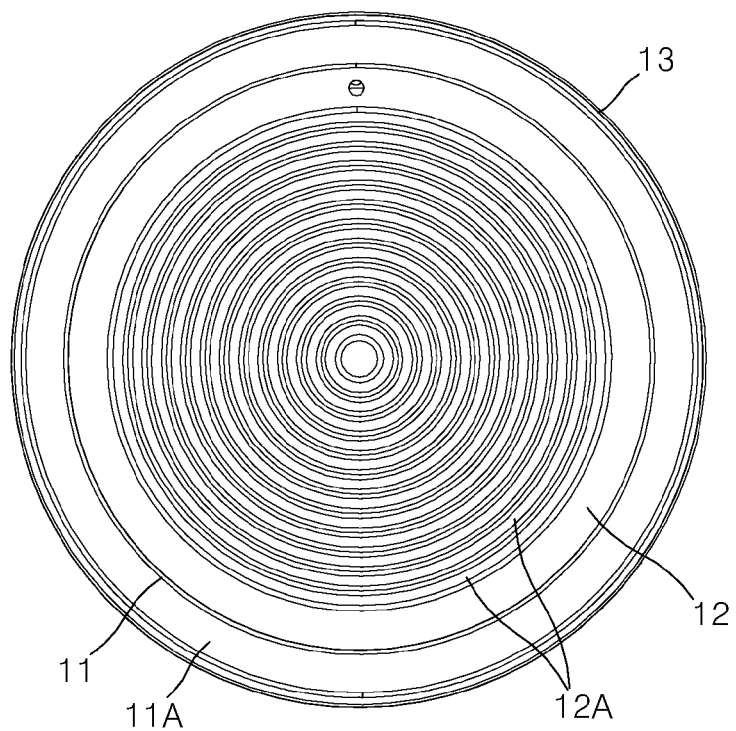
FIG. 6 is a front view illustrating a state in which the finger guard is removed from FIG. 5.
Figure 7:
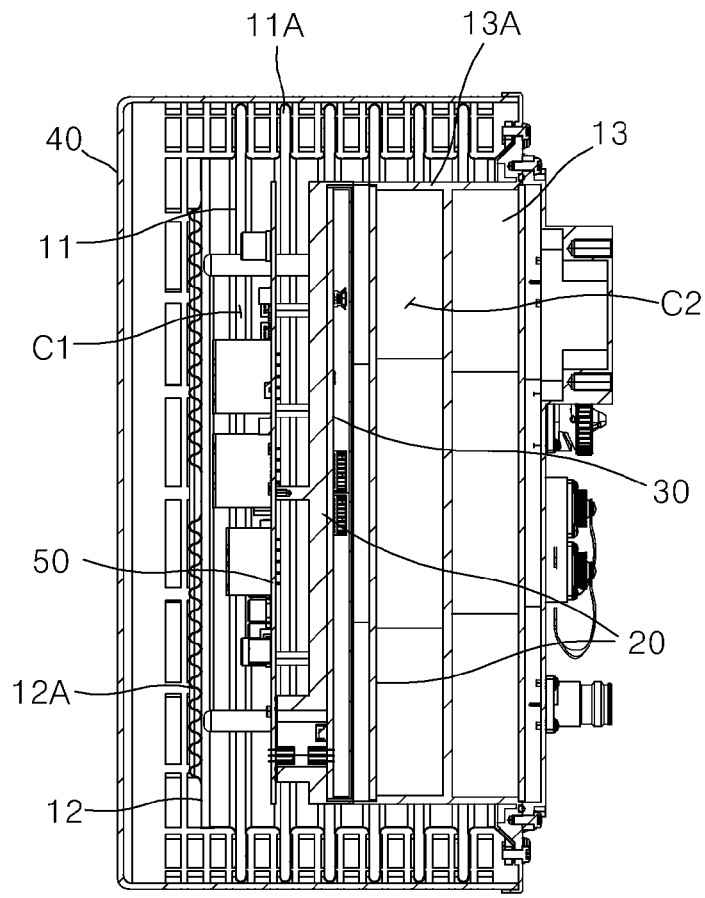
FIG. 7 is a side cross-sectional view of FIG. 1.

FIG. 1 is a perspective view illustrating a cooling apparatus for electronic elements according to a first embodiment of the present disclosure, FIG. 2 is a perspective view illustrating a state in which a finger guard is removed from FIG. 1, FIG. 3 is a plan view of FIG. 1, FIG. 4 is a plan view illustrating a state in which the finger guard is removed from FIG. 3, FIG. 5 is a front view of FIG. 1, FIG. 6 is a front view illustrating a state in which the finger guard is removed from FIG. 5, and FIG. 7 is a side cross-sectional view of FIG. 1.

Referring to FIGS. 1 to 7, the cooling apparatus for electronic elements according to the first embodiment of the present disclosure may include a heat dissipating housing 10, a shield case 20, a printed circuit board 30, and a finger guard 40.

However, the finger guard 40 is a component for surrounding an outer side of the heat dissipating housing 10 so as to prevent external foreign materials or external impacts from being transmitted to the heat dissipating housing 10 and prevent a finger of a person from touching the heat dissipating housing 10 from the outside, and the finger guard 40 may be excluded from the cooling apparatus for electronic elements according to the first embodiment of the present disclosure.

The heat dissipating housing 10 may be formed in a cylindrical shape having an internal space. However, the shape of the heat dissipating housing 10 is not limited to a cylindrical shape, and is not limited as long as it has a tubular shape having a space formed therein. For example, the heat dissipating housing 10 may be formed in a polygonal tubular shape such as a triangular tubular shape or a quadrangular tubular shape.

The heat dissipating housing 10 may be formed of a material with excellent heat dissipation performance. For example, the heat dissipating housing 10 may be formed of an aluminum material or a stainless material.

The heat dissipating housing 10 may be formed in a bellows shape whose length is changeable in a front-rear direction in the drawing. That is, a plurality of first pleated parts 11A folded in the front-rear direction may be formed to protrude from an outer surface of the heat dissipating housing 10.

The plurality of first pleated parts 11A may be formed in a folded shape and may be formed to be unfolded or folded due to a pressure in a first chamber C1.

That is, when the refrigerant in the first chamber C1, which will be described below, is vaporized, the plurality of first pleated parts 11A may be unfolded due to a pressure of the refrigerant to increase a contact area with external air.

However, the heat dissipating housing 10 is not necessarily formed in a bellows shape so as to increase the contact area with the external air. That is, as in a second embodiment which will be described below, instead of the plurality of first pleated parts 11A, a plurality of heat dissipating fins 11B may be formed to protrude from the outer surface of the heat dissipating housing 10.

The heat dissipating housing 10 may include a tubular housing body 11 having an open front surface and an open rear surface, a front cover 12 coupled to a front side of the housing body 11 and configured to cover the open front surface of the housing body 11, and a rear cover 13 coupled to a rear side of the housing body 11 and configured to cover the open rear surface of the housing body 11.

The plurality of first pleated parts 11A may be formed to protrude from the outer surface of the housing body 11. The housing body 11 may form a circumferential surface of the heat dissipating housing 10. The internal space of the housing body 11 may be an internal space of the heat dissipating housing 10.

The front cover 12 may form a front surface of the heat dissipating housing 10. A plurality of second pleated parts 12A may be formed on the front cover 12. In the present embodiment, the plurality of second pleated parts 12A are formed in a ring shape and disposed on a concentric circle, but the shape of the plurality of second pleated parts 12A is not limited to the ring shape and may be formed in a polygonal shape disposed on a concentric circle.

The plurality of first pleated parts 11A may be unfolded or folded due to the pressure in the first chamber C1, whereas the plurality of second pleated parts 12A may not be unfolded or folded and the shape thereof may not be changed. That is, the plurality of second pleated parts 12A are formed to be bent in a zigzag shape forward and backward on a side cross-section, and thus any one among adjacent second pleated parts may be formed with a convex front surface and a concave rear surface, and the other second pleated part thereamong may be formed with a concave front surface and a convex rear surface.

The rear cover 13 may form a rear surface of the heat dissipating housing 10. A vacuum generating mechanism (not shown) for making the first chamber C1, which will be described below, in a vacuum state and a pressure detection sensor 71 (see FIG. 8) for measuring a pressure in the first chamber C1 may be installed in the rear cover 13. However, the vacuum generating mechanism and the pressure detection sensor 71 are not necessarily installed in the rear cover 13 and may be installed in the front cover 12.

The housing body 11 may be formed in a cylindrical shape with an open front surface and an open rear surface. The front cover 12 may be formed in a disc shape covering the open front surface of the housing body 11. The rear cover 13 may be formed in a disc shape covering the open rear surface of the housing body 11. The front cover 12 may be formed to have a diameter that is smaller than that of the rear cover 13. The rear cover 13 may be formed to have a diameter that is greater than that of the front cover 12. The front cover 12 may be formed to have a diameter that is substantially equal to an outer diameter of the housing body 11. The rear cover 13 may be formed to have a diameter that is greater than the outer diameter of the housing body 11, and thus an edge of the rear cover 13 may be disposed to protrude to an outer side of the housing body 11. The edge of the rear cover 13 may be disposed to further protrude outward than the plurality of first pleated parts 11A.

The finger guard 40 may be formed in a tubular shape with an open rear surface, a front portion of the heat dissipating housing 10, excluding the rear cover 13, may be disposed to be inserted into the finger guard 40 through the open rear surface of the finger guard 40.

A tubular-shaped insertion part 13A may be formed to protrude forward from a front surface of the rear cover 13. The insertion part 13A may be integrally formed on the front surface of the rear cover 13 or may be separately formed from the rear cover 13 and fastened to the rear cover 13 through a plurality of fastening members such as bolts.

The insertion part 13A may be inserted into the housing body 11. An internal space of the insertion part 13A may become the second chamber C2 which will be described below, and an outer space of the insertion part 13A of the internal space of the housing body 11 may become the first chamber C1. The shield case 20 may cover an open front end of the insertion part 13A inserted into the housing body 11 and may be coupled to the front end of the insertion part 13A.

The shield case 20 may be disposed inside the heat dissipating housing 10 to partition the internal space of the heat dissipating housing 10 into the first chamber C1 and the second chamber C2.

The first chamber C1 may form a front side portion of the internal space of the heat dissipating housing 10, and the second chamber C2 may form a rear side portion of the internal space of the heat dissipating housing 10. In addition, the second chamber C2 may be disposed inward than the first chamber C1 in a radial direction of the heat dissipating housing 10. The positions of the first chamber C1 and the second chamber C2 are not limited thereto, and the first chamber C1 and the second chamber C2 may be disposed in a front-rear direction.

The shield case 20 may partition the first chamber C1 and the second chamber C2 such that the first chamber C1 and the second chamber C2 become independent spaces. The shield case 20 may seal between the first chamber C1 and the second chamber C2.

The first chamber C1 may be a space in a vacuum state. That is, the first chamber C1 may become a vacuum state by the vacuum generating mechanism. The first chamber C1 may be a sealed space.

The second chamber C2 may be a space in a non-vacuum state. The second chamber C2 may be a sealed space.

The first chamber C1 may be filled with the refrigerant. The refrigerant with which the first chamber C1 is filled may be vaporized due to heat generated from a heating element provided in the printed circuit board 30 and evaporated, thereby dissipating the heat.

The printed circuit board 30 may be disposed inside the shield case 20. The shield case 20 may surround the printed circuit board 30 to prevent the refrigerant with which the first chamber C1 is filled from flowing into the printed circuit board 30.

The shield case 20 may include two parts coupled to each other, and thus the printed circuit board 30 may be seated on a first part, and then a second part may be coupled to the first part while covering the printed circuit board 30.

The shield case 20 may be formed of a thermally conductive material and may transfer heat generated from the heating element provided in the printed circuit board 30 to the refrigerant with which the first chamber C1 is filled. The shield case 20 may be made of a metal material and may be formed of an aluminum material having excellent thermal conductivity or a stainless material.

The heating element may be mounted on the printed circuit board 30. The heating element may be provided on each of both surfaces of the printed circuit board 30. That is, the heating element may be provided on each of a surface of the printed circuit board 30 facing the first chamber C1 and a surface of the printed circuit board 30 facing the second chamber C2. However, the heating element is not necessarily provided on each of both surfaces of the printed circuit board 30 and may be provided on at least one surface of both surfaces of the printed circuit board 30.

The heating element may include a digital element, an RF element, and a filter element.

Since heat is generated from a front surface of the digital element, it is preferable that the digital element is disposed on a surface of the printed circuit board 30 facing the first chamber C1.

Since heat is generated from a rear surface of the RF element, it is preferable that the RF element is disposed on a surface of the printed circuit board 30 facing the second chamber C2.

In addition, since performance of the filter element is degraded in a vacuum state, it is preferable that the filter element is disposed on a surface of the printed circuit board 30 facing the second chamber C2.

Alternatively, a separate printed circuit board provided with a heating element such as the filter element whose performance is degraded in a vacuum state may be installed in the second chamber C2.

Meanwhile, the cooling apparatus for electronic elements according to the embodiment of the present disclosure may further include a spraying part for spraying the refrigerant into the first chamber C1 to fill the first chamber C1 with the refrigerant, and a refrigerant supply part for supplying the refrigerant to the spraying part.

The spraying part may be formed in a tubular shape disposed in the first chamber C1, and in this case, a plurality of spray holes spaced apart from each other along a length may be formed in the spraying part. That is, the spraying part may be formed as a spray nozzle 74 (see FIG. 8) which is formed in a tubular shape having a predetermined length and includes the plurality of spray holes spaced apart from each other along the length.

Figure 8:
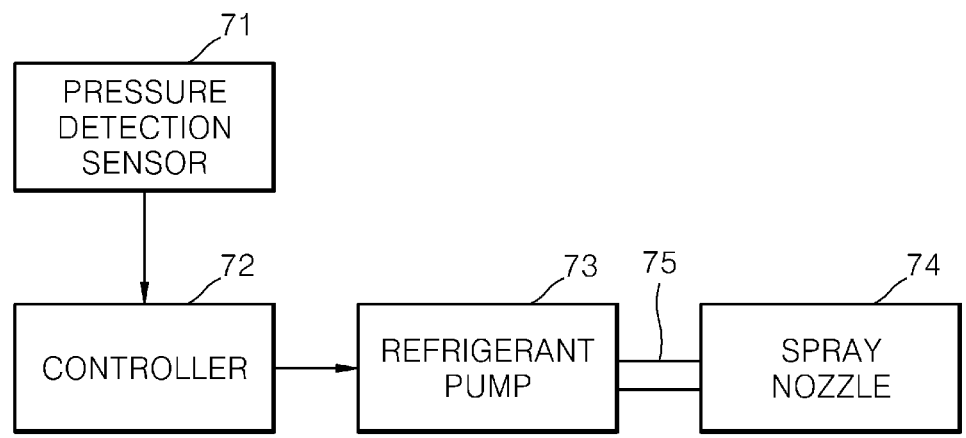
FIG. 8 is a control block diagram illustrating the cooling apparatus for electronic elements according to the first embodiment of the present disclosure.

The refrigerant supply part may include a refrigerant pump 73 (see FIG. 8). The refrigerant pump 73 may be connected to the spray nozzle 74 through a transfer pipe 75 (see FIG. 8). The refrigerant pump 73 may pressure-transfer the refrigerant to the transfer pipe 75, and the transfer pipe 75 may connect the refrigerant pump 73 to the spray nozzle 74. Therefore, the refrigerant pressure-transferred to the transfer pipe 75 by an operation of the refrigerant pump 73 may be moved to the spray nozzle 74 and sprayed into the first chamber C1 through the plurality of spray holes formed in the spray nozzle 74.

The shield case 20 may evaporate the refrigerant using sensible heat transferred from the heating element to the shield case 20 and latent heat transferred from the shield case 20 to the first chamber C1.

The refrigerant in the first chamber C1 may be vaporized by the latent heat. The vaporized refrigerant may be condensed due to the heat exchange of the plurality of first pleated parts 11A with external air, the plurality of first pleated parts 11A protruding from the outer surface of the heat dissipating housing 10.

The refrigerant supply part may supply the refrigerant condensed in the first chamber C1 to the spraying part. To this end, the refrigerant pump 73, the transfer pipe 75, and the spray nozzle 74 may be disposed in the first chamber C1, and thus the refrigerant pump 73 may pressure-transfer the condensed refrigerant in the first chamber C1 to the transfer pipe 75, and the refrigerant pressure-transferred to the transfer pipe 75 may be moved to the spray nozzle 74 and then sprayed into the first chamber C1 through the plurality of spray holes.

In this way, the refrigerant in the first chamber C1 may be repeatedly vaporized and condensed and may be circulated in the first chamber C1 by the refrigerant pump 73 and the spray nozzle 74.

Meanwhile, a power supply unit 50 may be installed in the first chamber C1. The power supply unit 50 is a component for supplying electric power to electric components included in the cooling apparatus for electronic elements according to the embodiment of the present disclosure, and may supply electric power to the printed circuit board 30.

The power supply unit 50 may include a substrate and a heating element. Accordingly, heat may be generated even in the power supply unit 50, and the refrigerant in the first chamber C1 may be vaporized and evaporated due to the heat generated in the power supply unit 50 to dissipate the heat of the power supply unit 50.

In order to prevent the refrigerant with which the first chamber C1 is filled from being introduced into the power supply unit 50 to cause a short circuit, the power supply unit 50 is preferably coated for heat radiation and waterproof.

A plurality of external air entrance holes 41 through which external air enters and exits may be formed in the finger guard 40. The external air may be moved to the outer side of the heat dissipating housing 10 through the plurality of external air entrance holes 41 so that the heat dissipating housing 10 may exchange heat with the external air.

The finger guard 40 may include a front surface and a circumferential surface. The plurality of external air entrance holes 41 may be formed in the front surface of the finger guard 40, and the plurality of external air entrance holes 41 may be formed even in the circumferential surface of the finger guard 40.

The finger guard 40 may be formed in a grille structure having the plurality of external air entrance holes 41, but the present disclosure is not necessarily limited to the grille structure so as to have the plurality of external air entrance holes 41.

The finger guard 40 may be formed in a cylindrical shape with an open rear surface. However, the shape of the finger guard 40 is not necessarily limited to the cylindrical shape and may be formed in a shape corresponding to the shape of the heat dissipating housing 10.

The heat dissipating housing 10 may be inserted into the finger guard 40 through the open rear surface of the finger guard 40. When the heat dissipating housing 10 is inserted into the finger guard 40, a rear end of the finger guard 40 may be seated on the front surface of the rear cover 13 of the heat dissipating housing 10.

FIG. 8 is a control block diagram illustrating the cooling apparatus for electronic elements according to the first embodiment of the present disclosure.

Referring to FIG. 8, the cooling apparatus for electronic elements according to the first embodiment of the present disclosure may further include a controller 72.

The controller 72 may control the refrigerant pump 73 according to the pressure of the first chamber C1 detected by the pressure detection sensor 71.

The pressure detection sensor 71 may input the detected pressure of the first chamber C1 to the controller 72, and the controller 72 may control the refrigerant pump 73 using the pressure of the first chamber C1 input from the pressure detection sensor 71.

For example, when the pressure of the first chamber C1 detected by the pressure detection sensor 71 is less than or equal to a first set pressure, the controller 72 may operate the refrigerant pump 73 so that the spray nozzle 74 sprays the refrigerant into the first chamber C1.

In addition, when the pressure of the first chamber C1 detected by the pressure detection sensor 71 is greater than or equal to a second set pressure, the controller 72 may stop the refrigerant pump 73 so that the spray nozzle 74 does not spray the refrigerant into the first chamber C1.

Here, the second set pressure may be a pressure that is higher than the first set pressure. The second set pressure may be a safe pressure at which the heat dissipating housing 10 does not explode. That is, when the pressure in the first chamber C1 is greater than or equal to the second set pressure, there is a possibility that the heat dissipating housing 10 explodes. Therefore, when the pressure of the first chamber C1 input from the pressure detection sensor 71 is greater than or equal to the second set pressure, the controller 72 may stop the refrigerant pump 73 so that the pressure in the first chamber C1 does not rise any more.

Figure 9:
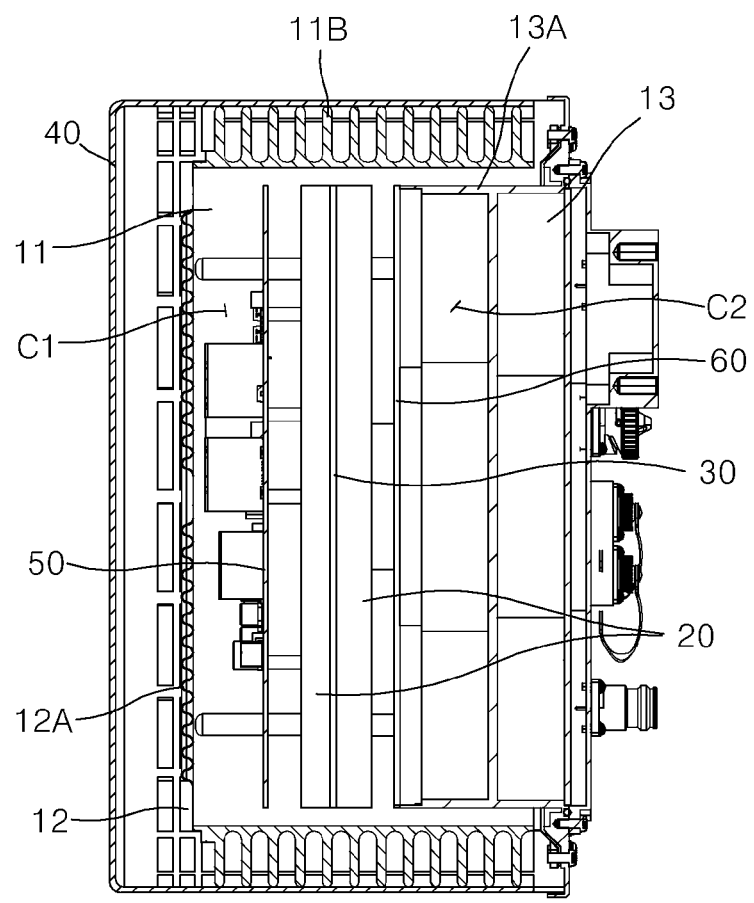
FIG. 9 is a side cross-sectional view illustrating a cooling apparatus for electronic elements according to a second embodiment of the present disclosure.

FIG. 9 is a side cross-sectional view illustrating a cooling apparatus for electronic elements according to a second embodiment of the present disclosure. Here, the same reference numerals are given to the same components as those of the first embodiment, and detailed descriptions thereof will be omitted herein, and only different points will be described.

Referring to FIG. 9, it can be seen that the cooling apparatus for electronic elements according to the second embodiment of the present disclosure is different from the first embodiment shown in FIG. 7.

That is, in the above-described first embodiment, the shield case 20 directly partitions the first chamber C1 and the second chamber C2, but in the second embodiment, a shield plate 60 is installed in a heat dissipating housing 10.

The shield plate 60 may seal by covering an open front end of an insertion part 13A inserted into a housing body 11. In this case, a shield case 20 may be spaced forward from the shield plate 60 and disposed in a first chamber C1.

In addition, in the above-described first embodiment, the plurality of first pleated parts 11A, which are unfolded and folded according to the refrigerant pressure in the first chamber C1, are formed on the outer surface of the housing body 11, but in the second embodiment, a plurality of heat dissipating fins 11B are formed on an outer surface of the housing body 11 instead of the plurality of first pleated parts 11A.

As for a cable connection of a printed circuit board installed in a second chamber C2, the first embodiment is more advantageous than the second embodiment, but one of the first embodiment and the second embodiment may be implemented according to a cable connection method of the printed circuit board installed in the second chamber C2.

Figure 10:
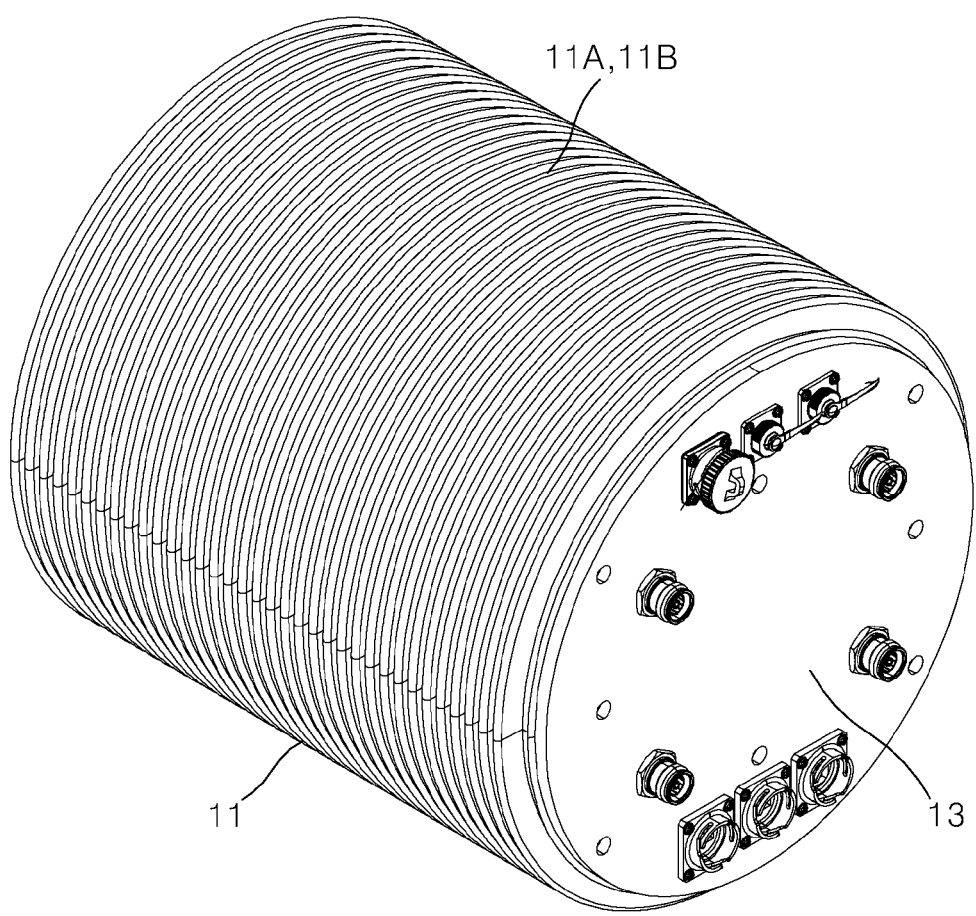
FIG. 10 is a perspective view illustrating a cooling apparatus for electronic elements according to a third embodiment of the present disclosure.
Figure 11:
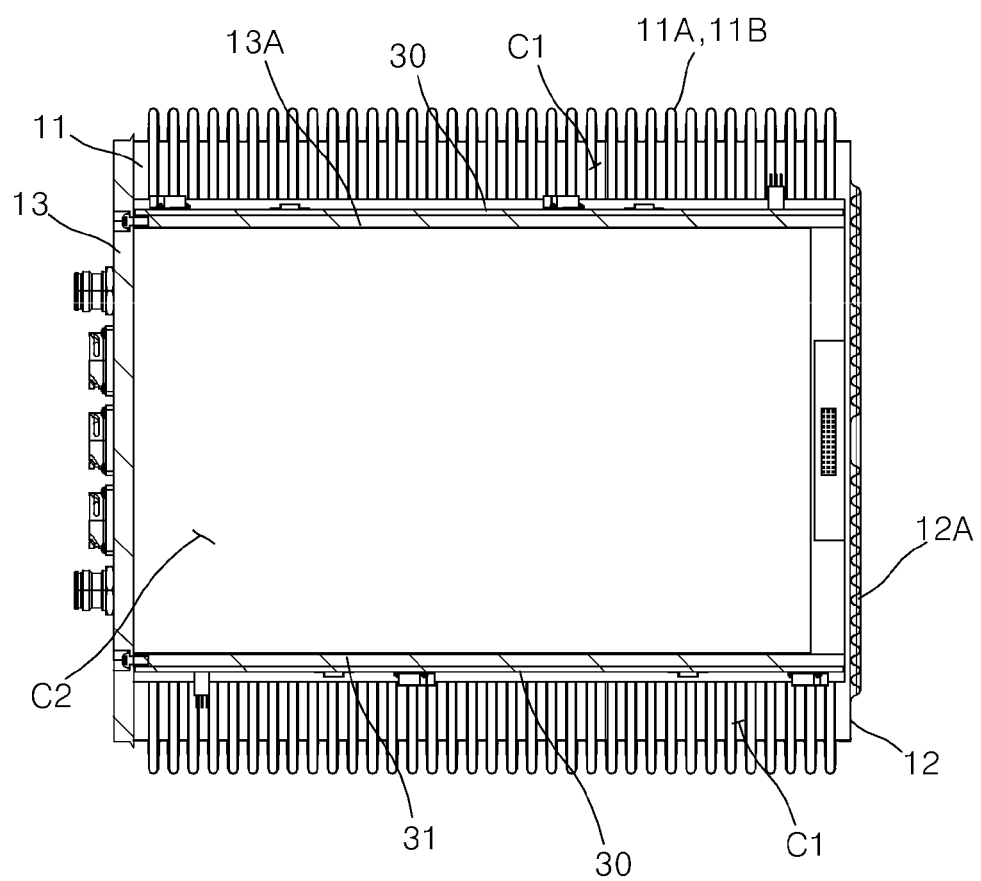
FIG. 11 is a side cross-sectional view of FIG. 10.
Figure 12:
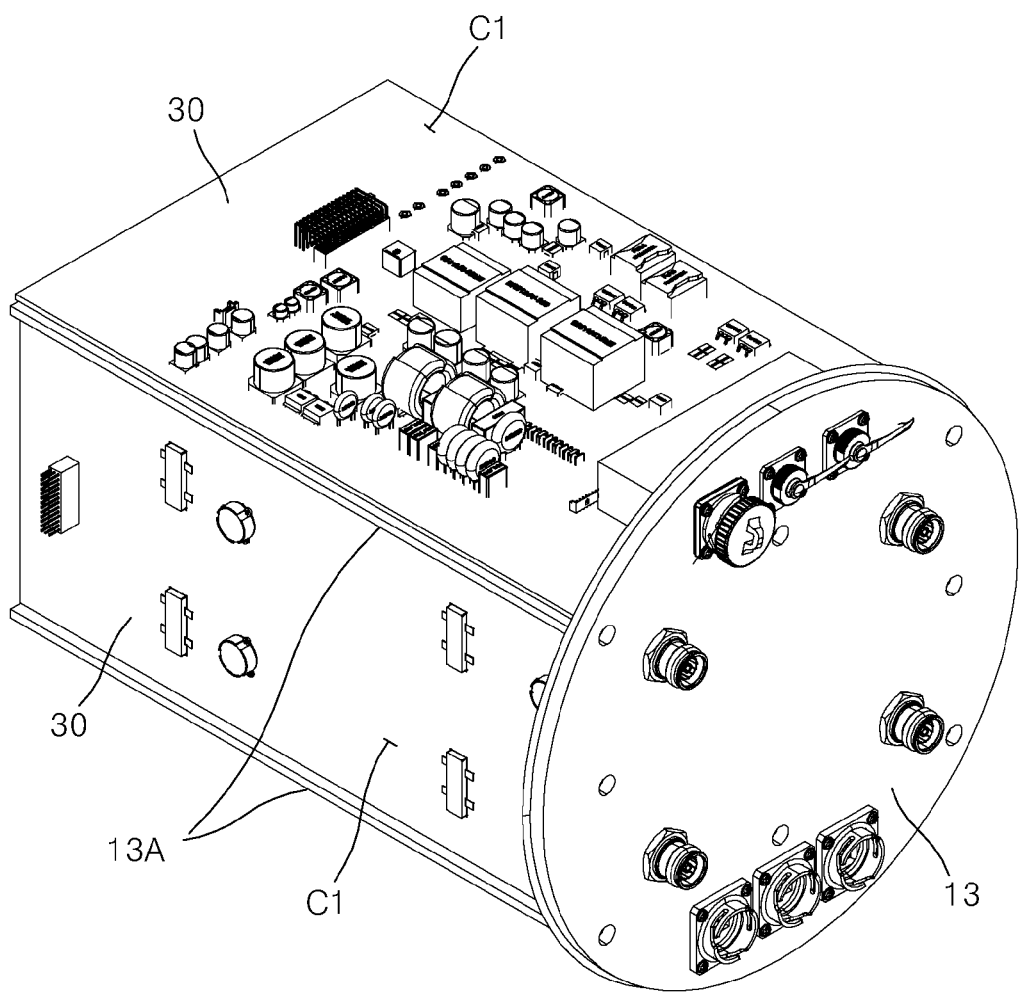
FIG. 12 is one side perspective view illustrating a substrate mount and a printed circuit board which are shown in FIG. 11.
Figure 13:
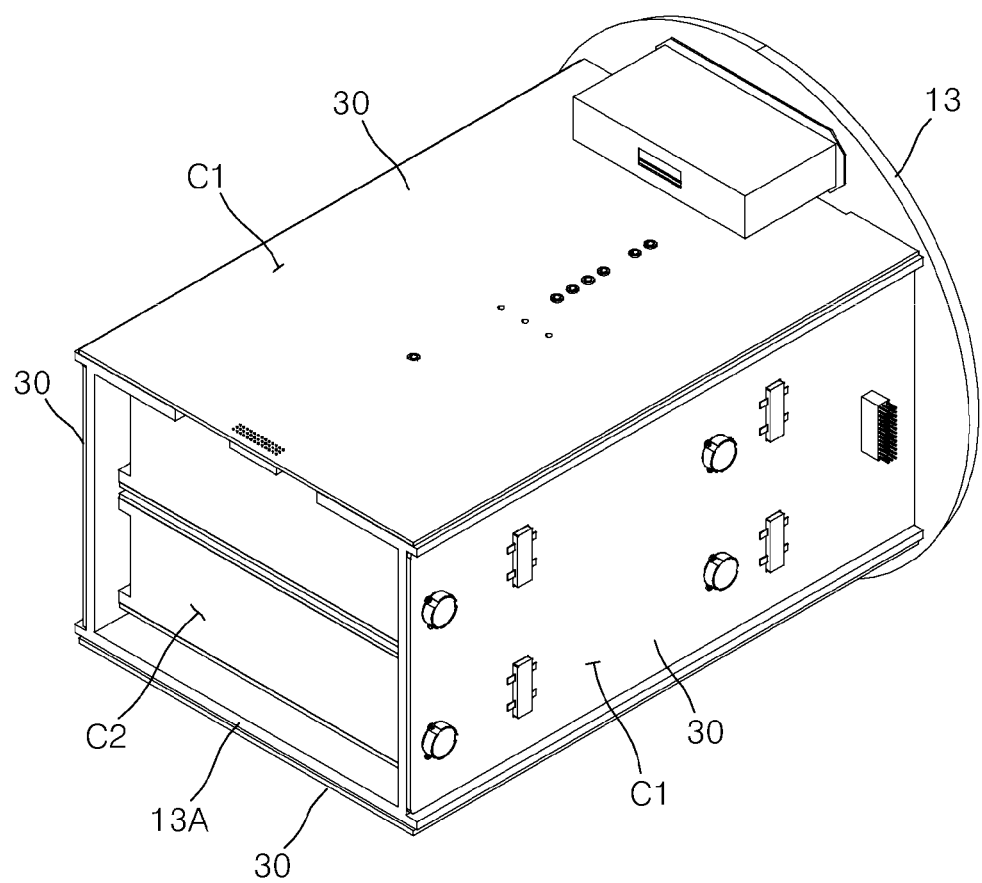
FIG. 13 is the other side perspective view illustrating the substrate mount and the printed circuit board which are shown in FIG. 11.

FIG. 10 is a perspective view illustrating a cooling apparatus for electronic elements according to a third embodiment of the present disclosure, FIG. 11 is a side cross-sectional view of FIG. 10, FIG. 12 is one side perspective view illustrating a substrate mount and a printed circuit board which are shown in FIG. 11, and FIG. 13 is the other side perspective view illustrating the substrate mount and the printed circuit board which are shown in FIG. 11. Here, the same reference numerals are given to the same components as those of the first embodiment, and detailed descriptions thereof will be omitted herein, and only different points will be described.

Referring to FIGS. 10 to 13, it can be seen that the cooling apparatus for electronic elements according to the third embodiment of the present disclosure is different from the first embodiment and the second embodiment.

That is, in the above-described first and second embodiments, the printed circuit board 30 is installed in the shield case 20 to prevent infiltration of the refrigerant, but in the third embodiment, the shield case 20 is not provided, but the printed circuit board 30 is coated for heat radiation/waterproof.

Therefore, in the above-described first and second embodiments, the shield case 20 partitions the internal space of the heat dissipating housing 10 into the first chamber C1 and the second chamber C2, but in the third embodiment, the printed circuit board 30 partitions the internal space of the heat dissipating housing 10 into the first chamber C1 and the second chamber C2.

In addition, in the third embodiment, at least one flat portion may be formed on the outer surface of the insertion part 13A. Here, the flat portion may be a portion which is formed to be flat and on which the printed circuit board is mounted.

In the third embodiment, it is shown that the insertion part 13A is formed in a quadrangular tubular shape so that four flat portions are formed, and the printed circuit board 30 is mounted on each of the four flat portions, but the insertion part 13A is not necessarily limited to a quadrangular tubular shape and may be formed in a polygonal tubular shape including a triangular tubular shape. In addition, the insertion part 13A may be formed in a cylindrical shape with one flat portion formed on one side thereof.

The first chamber C1 may be an outer space of the flat portion of the internal space of the housing body 11. That is, the first chamber C1 may be a space between an outer surface of the flat portion and an inner surface of the housing body 11. Accordingly, the first chamber C1 may be formed in the same number as the number of the flat portions.

The second chamber C2 may be an internal space of the insertion part 13A. A front end of the insertion part 13A inserted into the housing body 11 may come into contact with the rear surface of the front cover 12 so that the second chamber C2 may be formed as a sealed space.

In the cooling apparatus for electronic elements according to the embodiments of the present disclosure, which is configured as described above, the refrigerant with which the first chamber C1 is filled is vaporized and evaporated due to heat generated from the heating element provided in the printed circuit board 30.

The refrigerant evaporated in the first chamber C1 may be condensed due to heat exchange of the plurality of first pleated parts 11A and the plurality of second pleated parts 12A with external air or heat exchange of heat dissipating fins 11B with external air.

The refrigerant condensed in the first chamber C1 may be moved to the refrigerant pump 73, the refrigerant pump 73 may supply the condensed refrigerant to the spray nozzle 74, and the spray nozzle 74 may spray the refrigerant into the first chamber C1 again.

By repeating the above process, the heat generated from the heating element can be quickly dissipated.

As described above, in the cooling apparatus for electronic elements according to the embodiments of the present disclosure, in the case of the first embodiment and the second embodiment including the shield case 20, the printed circuit board 30 provided with the heating element is installed inside the shield case 20 so that the heat generated from the heating element is transferred to the shield case 20. The heat transferred to the shield case 20 is heat-exchanged with the refrigerant of the first chamber C1 to evaporate the refrigerant and dissipate the heat.

In addition, in the cooling apparatus for electronic elements according to the present disclosure, in the case of the third embodiment in which the shield case 20 is not provided and the printed circuit board 30 is coated so that the refrigerant does not infiltrate into the printed circuit board 30, the refrigerant in the first chamber C1 exchanges heat generated from the heating element to evaporate the refrigerant and dissipate the heat.

As described above, according to the cooling apparatus for electronic elements according to the embodiments of the present disclosure, heat generated from the heating element can be rapidly dissipated through a phase change of the refrigerant, and there is no need to install lots of mechanical air cooling heat dissipation structures, which makes it possible to reduce a size of the cooling apparatus.

It will be apparent to those skilled in the art that various changes and modifications may be made without departing from the spirit and scope of the present disclosure. Therefore, it should be understood that the above-described embodiments are not restrictive but illustrative in all aspects. The scope of the present disclosure is defined by the appended claims rather than the detailed description, and it should be construed that all alternations or modifications derived from the meaning and scope of the appended claims and the equivalents thereof fall within the scope of the present disclosure.

INDUSTRIAL APPLICABILITY

The present disclosure provides a cooling apparatus for electronic elements which has a minimized size and improved heat dissipation performance.

The invention claimed is:

1. A cooling apparatus for electronic elements, comprising:
a heat dissipating housing having an internal space formed therein;
a shield case made of a thermally conductive material, disposed in the heat dissipating housing, and partitions the internal space into a first chamber which is a vacuum space filled with a refrigerant and a second chamber which is a non-vacuum space; and
a printed circuit board disposed in the shield case and provided with a heating element,
wherein the shield case evaporates the refrigerant using sensible heat transferred from the heating element to the shield case and latent heat transferred from the shield case to the first chamber, wherein:

the heat dissipating housing includes a housing body and a rear cover which covers an open rear surface of the housing body;

an insertion part is formed to protrude forward from a front surface of the rear cover;

the first chamber is an outer space of the insertion part of the internal space of the housing body; and the second chamber is an internal space of the insertion part.

2. The cooling apparatus 1, wherein the heat dissipating housing is formed in the form of a bellows.

3. The cooling apparatus 1, wherein a heat dissipating fin is formed to protrude from an outer surface of the heat dissipating housing.

4. The cooling apparatus 1, further comprising:

a power supply unit disposed in the first chamber and configured to supply electric power to the printed circuit board.

5. The cooling apparatus 1, further comprising:

a finger guard which surrounds an outer side of the heat dissipating housing and having a plurality of external air entrance holes formed therein.

6. The cooling apparatus 1, further comprising:

a spray nozzle configured to spray the refrigerant into the first chamber; and a refrigerant pump configured to supply the refrigerant to the spray nozzle.

7. The cooling apparatus 6, further comprising:

a pressure detection sensor configured to detect a pressure of the first chamber; and a controller configured to operate the refrigerant pump when the pressure of the first chamber detected by the pressure detection sensor is less than or equal to a first set pressure, and stop the refrigerant pump when the pressure of the first chamber detected by the pressure detection sensor is greater than or equal to a second set pressure that is higher than the first set pressure.

8. The cooling apparatus 6, wherein the refrigerant pump supplies the refrigerant condensed in the first chamber to the spray nozzle.

9. A cooling apparatus for electronic elements, comprising:

a heat dissipating housing having an internal space formed therein;

a shield case made of a thermally conductive material, disposed in the heat dissipating housing, and partitions the internal space into a first chamber which is a vacuum space filled with a refrigerant and a second chamber which is a non-vacuum space; and a printed circuit board disposed in the shield case and provided with a heating element, wherein the shield case evaporates the refrigerant using sensible heat transferred from the heating element to the shield case and latent heat transferred from the shield case to the first chamber, wherein:

the heat dissipating housing includes a housing body and a rear cover which covers an open rear surface of the housing body;

an insertion part is formed to protrude forward from a front surface of the rear cover;

the cooling apparatus further includes a shield plate which covers the open front end of the insertion part inserted into the housing body;

the first chamber is an outer space of the insertion part of the internal space of the housing body;

the second chamber is an internal space of the insertion part; and the shield case is spaced apart from the shield plate and disposed in the first chamber.

10. A cooling apparatus for electronic elements, comprising:

a heat dissipating housing having an internal space formed therein; and a coated printed circuit board disposed inside the heat dissipating housing, which partitions an inner space into a first chamber which is a vacuum space filled with a refrigerant, and a second chamber which is a non-vacuum space, and provided with a heating element, wherein the refrigerant is evaporated due to heat generated from the heating element, wherein the heat dissipating housing includes a housing body and a rear cover which covers an open rear surface of the housing body:

an insertion part is formed to protrude forward from a front surface of the rear cover;

at least one flat portion on which the printed circuit board is mounted may be formed on an outer surface of the insertion part;

the first chamber is an outer space of the flat portion of the internal space of the housing body; and the second chamber is an internal space of the insertion part.

11. The cooling apparatus 10, wherein the heat dissipating housing is formed in the form of a bellows.

12. The cooling apparatus 10, wherein a heat dissipating fin is formed to protrude from an outer surface of the heat dissipating housing.

13. The cooling apparatus 10, further comprising:

a power supply unit disposed in the first chamber and configured to supply electric power to the printed circuit board.

14. The cooling apparatus 10, further comprising:

a finger guard which surrounds an outer side of the heat dissipating housing, and having a plurality of holes formed therein.

15. The cooling apparatus 10, further comprising:

a spray nozzle configured to spray the refrigerant into the first chamber; and a refrigerant pump configured to supply the refrigerant to the spray nozzle.

16. The cooling apparatus 15, further comprising:

a pressure detection sensor configured to detect a pressure of the first chamber; and a controller configured to operate the refrigerant pump when the pressure of the first chamber detected by the pressure detection sensor is less than or equal to a first set pressure, and stop the refrigerant pump when the pressure of the first chamber detected by the pressure detection sensor is greater than or equal to a second set pressure that is higher than the first set pressure.

17. The cooling apparatus 15, wherein the refrigerant pump supplies the refrigerant condensed in the first chamber to the spray nozzle.

18. The cooling apparatus 9, wherein the insertion part is tubular shaped.

19. The cooling apparatus 9, further comprising:

a power supply unit disposed in the first chamber and configured to supply electric power to the printed circuit board.

20. The cooling apparatus 9, further comprising:
a finger guard which surrounds an outer side of the heat dissipating housing and having a plurality of external air entrance holes formed therein.

* * * * *